United States Patent
Ha et al.

(10) Patent No.: US 7,057,423 B2
(45) Date of Patent: Jun. 6, 2006

(54) CURRENT-VOLTAGE TRANSFORMING CIRCUIT EMPLOYING LIMITER CIRCUIT

(75) Inventors: Chang-Woo Ha, Kyunggi-Do (KR); Kyoung-Soo Kwon, Kyunggi-Do (KR); Deuk-Hee Park, Seoul (KR); Joo-Yul Ko, Kyunggi-Do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 10/712,452

(22) Filed: Nov. 12, 2003

(65) Prior Publication Data
US 2005/0046448 A1 Mar. 3, 2005

(30) Foreign Application Priority Data
Sep. 3, 2003 (KR) .................. 10-2003-0061480

(51) Int. Cl.
*H03C 3/00* (2006.01)
*H01L 31/00* (2006.01)
*H03K 17/78* (2006.01)

(52) U.S. Cl. .................. 327/101; 327/514; 330/308; 250/214 A

(58) Field of Classification Search ............... 327/101, 327/103, 514, 427, 434, 437; 330/308; 398/200, 398/202

See application file for complete search history.

(56) References Cited

U.S. PATENT DOCUMENTS

| | | | |
|---|---|---|---|
| 5,532,471 A * | 7/1996 | Khorramabadi et al. | 250/214 A |
| 5,636,048 A * | 6/1997 | Kogure et al. | 398/202 |
| 5,777,507 A * | 7/1998 | Kaminishi et al. | 327/514 |
| 5,880,610 A * | 3/1999 | Nishizono et al. | 327/103 |
| 6,275,541 B1* | 8/2001 | Nagahori et al. | 375/318 |
| 6,384,689 B1* | 5/2002 | Kimura | 330/308 |
| 6,476,954 B1* | 11/2002 | Nishizono | 398/202 |
| 6,714,063 B1* | 3/2004 | Nishizono | 327/345 |
| 6,778,021 B1* | 8/2004 | Denoyer et al. | 330/308 |
| 2003/0219260 A1* | 11/2003 | Chiou et al. | 398/202 |

FOREIGN PATENT DOCUMENTS

| | | | |
|---|---|---|---|
| DE | 3743765 | * | 12/1987 |
| JP | 10-188315 | | 7/1998 |

* cited by examiner

*Primary Examiner*—Tuan T. Lam
(74) *Attorney, Agent, or Firm*—Gottlieb, Rackman & Reisman, P.C.

(57) ABSTRACT

A current-voltage transforming circuit used with a photo detector integrated circuit includes a photo detector to detect a photo signal (laser beam signal) to generate a photo current, an amplifier to amplify the photo current, which corresponds to the photo signal, an emitter follower to receive an output of the amplifier, an output buffer to receive an output of the emitter follower, a current detecting limiter unit having an input terminal and an output terminal and turned on to generate a limiter current when the detected current outputted from the amplifier is greater than a predetermined current, and a feedback resistor connected between the photo detector and an output terminal of the output buffer.

14 Claims, 13 Drawing Sheets

CURRENT-VOLTAGE TRANSFORMING CIRCUIT EMPLOYING LIMITER CIRCUIT

CROSS-REFERENCE TO RELATED APPLICATION

This application claims to benefit of Korean Patent Application No. 2003-0061480, filed Sep. 29, 2003, in the Korean Intellectual Property Office, the disclosure of which is incorporated herein by reference.

BACKGROUND OF THE INVENTION

1. Field of the Invention

The present invention relates to a current-voltage transforming (converting and amplifying) circuit employing a limiter circuit unit used with a photo detector integrated circuit, and more particularly, to a photo detector integrated circuit having a current-voltage transforming (converting and amplifying) circuit employing a limiter circuit unit detecting a current flowing through the current-voltage transforming circuit to generate a limiter current to the current-voltage transforming circuit, thereby preventing saturation of the current-voltage transforming circuit occurring when a high optical power is supplied to the photo detector integrated circuit during a writing operation of writing data on a recording medium, such as a CD-RW, in a disc recording and/or reading apparatus.

2. Description of the Related Art

Generally, an. optical pickup apparatus recording information on and/or reading information from a recording medium, such as a CD-RW, includes a photo detector integrated circuit (PDIC) detecting an optical beam reflected from an optical recording medium, such as an optical disc, containing information by a laser beam generated from a laser diode.

In a recordable CD, such as the CD-RW, a writing operation is performed by projecting the laser beam having a high power on a surface of the CD to form a pit on the surface of the CD. When an excessive power of the laser beam is supplied to the PDIC during the writing operation, a great amount of current generates to cause a current-voltage transforming (converting and/or amplifying) circuit of the PDIC to be saturated, thereby distorting an over-response characteristic of the current-voltage transforming circuit of the PDIC.

FIG. 1 is a view showing a conventional current-voltage transforming (converting and/or amplifying) circuit having a limiter circuit in a photo detector integrated circuit.

A photo detector (PD) current $I_{PD}$ is generated by carriers generated from a photo detector (PD) 12 to which an input laser beam is reflected. The PD current $I_{PD}$ pulls a feedback (FD) current $I_f$ from an output buffer G3, the FD current $I_f$ generates a voltage difference on both ends of the feedback resistor when flowing through the feedback resistor having a resistance of $R_f$, and the PD current $I_{PD}$ is converted into a voltage signal $V_{OUT}$ of $V_{OUT}=I_f \times R_f$.

A differential amplifier G1, an emitter follower G2, and the output buffer G3 constitutes a trans-impedance amplifier 10. If an excessive optical signal is inputted into the PD 12, the trans-impedance amplifier 10 is saturated to be out of an operational range. Due to this saturation of the trans-impedance amplifier 10, when the FD current $I_f$ increases, the output voltage $V_{OUT}$ is no longer increased, an amplification speed of the current-voltage transforming circuit becomes slow even in response to a small amount of an input signal, and an excessive response characteristic of the current-voltage transforming circuit is distorted.

Referring to FIG. 1, an emitter of a transistor Q1 is connected to an output terminal of the emitter follower G2 to detect an output of the emitter follower G2. When an output voltage of the emitter follower G2 is greater than a predetermined value of $V_{LMT}+V_{BE}$, the transistor Q is turned on so that the limiter current $I_{LMT}$ is allowed to flow through the current-voltage transforming circuit. At a terminal $T_{in}$, $I_{PD}=I_f+I_{LMT}$. Even if the PD current $I_{PD}$ is excessively increased, the FD current $I_f$ is no longer increased, and the trans-impedance amplifier 10 is not saturated but continues to operate.

As described above, in order to prevent the current-voltage transforming circuit from being saturated, an output voltage of the trans-impedance amplifier 10 is detected. When the output voltage is greater than a predetermined voltage, the limiter current $I_{LMT}$ is allowed to flow through the trans-impedance amplifier 10 so as to prevent the trans-impedance amplifier from being saturated.

In Japanese patent publication no.: 10-188315, disclosed on Jul. 21, 1998, an output voltage of a current-voltage transforming circuit is detected to allow a limiter current to flow into the current-voltage transforming circuit when the output voltage is greater than a predetermined value, so that saturation of the current-voltage transforming circuit is prevented.

The current-voltage transforming circuit disclosed in the above Japanese publication includes a first amplifier, a second amplifier, and an output buffer. An emitter of a transistor is connected to receive an output of the second amplifier, and the transistor is turned on to generate the limiter current $I_{LT}$ when the output of the second amplifier is greater than $V_{REF}+V_{BE}$, that is, $V_0>V_{REF}+V_{BE}$. Therefore, a feed back current $I_f$ is no longer increased even if a current $I_{PH}$ flowing through a photo detector is increased, so that the saturation of the current-voltage transforming circuit is prevented.

The above conventional current-voltage transforming circuit and the Japanese patent publication disclose that a current is compensated by detecting a voltage, and the Japanese patent publication discloses that the emitter of the transistor is connected to the second amplifier to perform a switching operation on the limiter current $I_{LT}$ as well as to control the output voltage $V_0$ to be below $V_{REF}+V_{BE}$.

However, the circuit having a PNP type transistor is designed to limit a maximum value of a predetermined terminal voltage controlled according to a characteristic of the PNP type transistor, and the circuit having an NPN type transistor is designed to limit a minimum value of the predetermined terminal voltage controlled according to the characteristic of the NPN transistor.

In the above patent publication, since the maximum value of the output voltage $V_0$ is controlled to below $V_{REF}+V_{BE}$, that is, the maximum value of the output voltage $V_0$ is limited below $V_{REF}+V_{BE}$, circuit elements should not be the NPN type transistor but the PNP type transistor. Accordingly, a current-voltage transforming circuit disclosed in the above patent publication should include the PNP type transistor, which has a lower gain than the NPN type transistor. Therefore, it is disadvantageous that the gain is lowered, and a speed becomes slow.

In order to solve the above problems, it is needed to develop an improved current-voltage transforming (converting and/or amplifying) circuit which does not limit the output voltage of the amplifier, which constitutes the current-voltage transforming circuit, to a predetermined value regardless of the NPN type transistor and the PNP type transistor, and dose not lower the gain and the speed.

SUMMARY OF THE INVENTION

In order to solve the above and/or other problems, it is an aspect of the present invention to provide a current-voltage transforming (converting and amplifying) circuit using a limiter current to prevent saturation in the current-voltage transforming (converting and amplifying) circuit used with a photo detector integrated circuit.

It is another aspect of the present invention to provide a current-voltage transforming circuit used with a photo detector integrated circuit to detect a current rather than a voltage of the current-voltage transforming circuit to generate a limiter current flowing into the current-voltage transforming circuit.

It is another aspect of the present invention to provide a current-voltage transforming circuit used with a photo detector integrated circuit to include a current detecting limiter unit switching a limiter current by detecting a current.

It is another aspect of the present invention to provide a current-voltage transforming circuit used with a photo detector integrated circuit to includes at least one NPN type transistor which is not limited to a maximum value or a minimum value, to detect a current to switch a limiter current, thereby improving a gain as well as a speed.

It is another aspect of the present invention to provide a current-voltage transforming circuit used with a photo detector integrated circuit to include a current detecting limiter unit in which a turn-on point of a limiter current is controlled by a user.

It is another aspect of the present invention to provide a current-voltage transforming circuit used with a photo detector integrated circuit to detect a current of the current-voltage transforming circuit to generate a limiter current to prevent saturation of the current-voltage transforming circuit, thereby improving characteristics, such as an over-response characteristic, of an RF wave of the current-voltage transforming circuit.

It is another aspect of the present invention to provide a disc recording and/or reading apparatus having a current-voltage transforming circuit.

Additional aspects and advantages of the invention will be set forth in part in the description which follows and, in part, will be obvious from the description, or may be learned by practice of the invention.

To achieve the above and/or other aspects, there is provided a current-voltage transforming circuit used with a photo detector integrated circuit, the current-voltage transforming circuit including a photo detector to detect a photo signal (laser beam signal) to generate a photo current, an amplifier to amplify the photo current, which corresponds to the photo signal, an emitter follower to receive an output of the amplifier, an output buffer to receive an output of the emitter follower, a current detecting limiter unit having an input terminal and an output terminal and turned on to generate a limiter current when the detected current outputted from the amplifier is greater than a predetermined current, and a feedback resistor connected between the photo detector and an output terminal of the output buffer.

To achieve the above and/or other aspects, there is provided a disc recording and/or reading apparatus having a current-voltage transforming circuit of a photo detector integrated circuit, the disc recording and/or reading apparatus including a photo detector generating a photo current in response to a photo signal inputted into the photo detector, a trans-impedance amplifier converting and amplifying the photo current to generate an output voltage, and generating first and second currents, and a current detecting limiter generating a limiter current in response to the first and second currents so that the trans-impedance amplifier is prevented.

According to another aspect of the present invention, the trans-impedance amplifier includes an amplifier amplifying the photo current received from the photo detector, an emitter follower coupled to the amplifier, an output buffer coupled to the emitter to generate the output voltage, and a feedback resistor coupled between the output buffer and the amplifier so that the photo current is converted into the output voltage.

According to another aspect of the present invention, the first and second currents are generated from one of a first junction between the amplifier and the emitter follower, a second junction between the emitter follower and the output buffer, and an output terminal of the output buffer.

According to another aspect of the present invention, the limiter current is outputted to one of a junction between the output buffer and the amplifier and a reference potential.

According to another aspect of the present invention, the first and second currents are different from each other.

According to another aspect of the present invention, the current detecting limiter unit outputs one of the first and second currents as the limiter current when the other one of the first and second currents is greater than a predetermined reference value.

BRIEF DESCRIPTION OF THE DRAWINGS

These and/or other advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
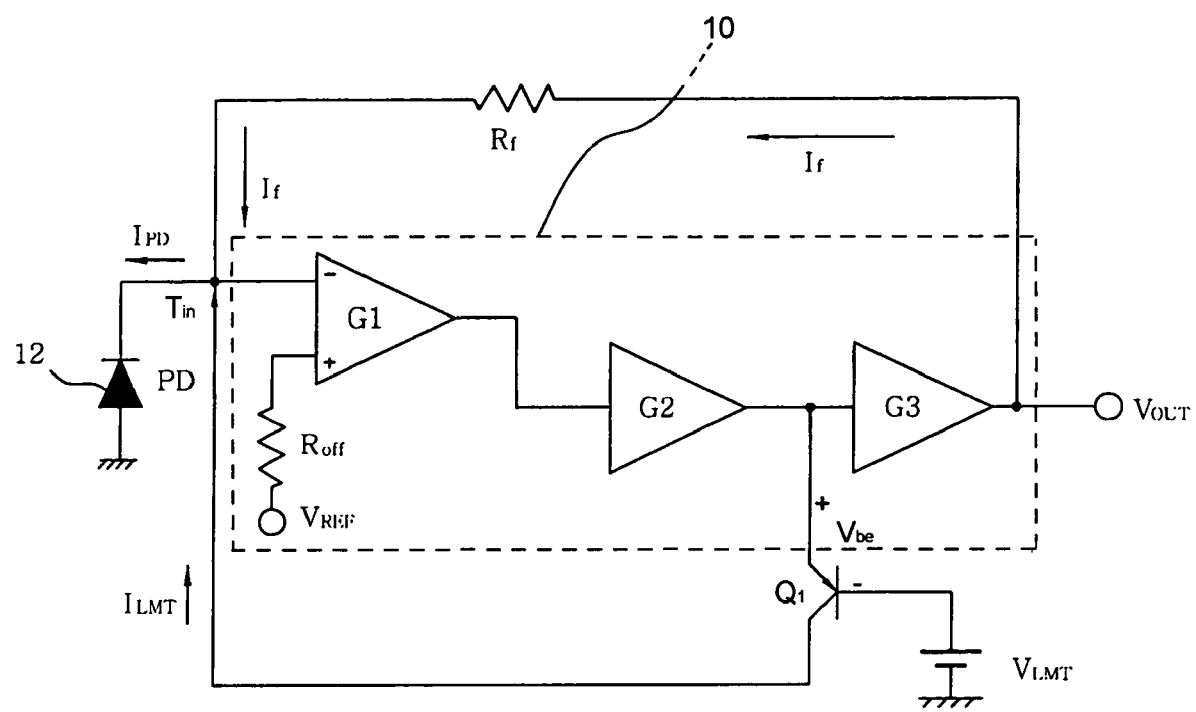
FIG. 1 is a view showing a conventional current-voltage transforming circuit having a limiter circuit in a photo detector integrated circuit.

Reference will now be made in detail to the present preferred embodiments of the present invention, examples of which are illustrated in the accompanying drawings, wherein like reference numerals refer to the like elements throughout. The embodiments are described below in order to explain the present invention by reference to the figures.

Figure 2:
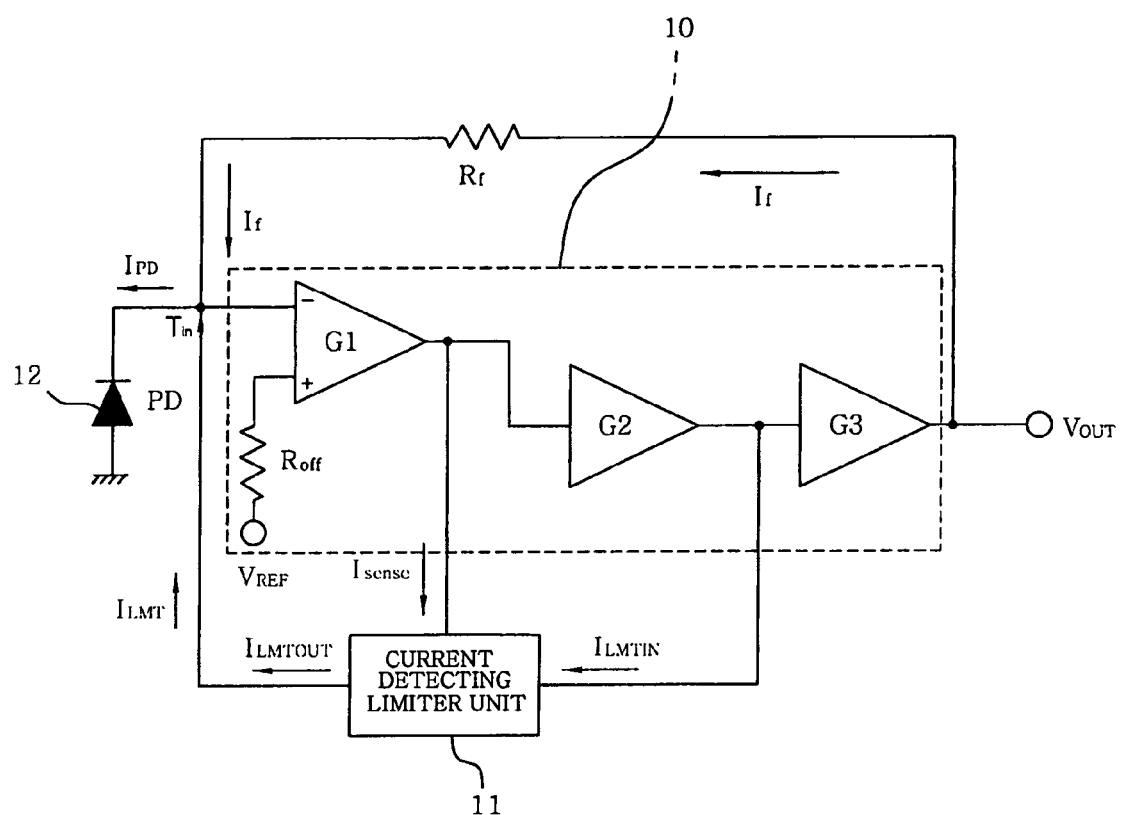
FIG. 2 is a view showing a current-voltage transforming circuit having a limiter circuit used with a photo detector integrated circuit according to an embodiment of the present invention.

FIG. 2 is a view showing a current-voltage transforming circuit 10 having a current detecting limiter unit 11 used with a photo detector integrated circuit according to an embodiment of the present invention.

A photo detector 12 generates a photo current $I_{PD}$ in response to a photo signal, such as laser beam (light), inputted to the photo detector 12. The photo current $I_{PD}$ pulls a feedback (FB) current $I_f$ from an output buffer G3. When the FD current $I_f$ flows through a feedback resistor having a resistance of $R_f$, a voltage difference is generated between both ends of the feed back resistor so that the FD current $I_f$ is converted into a voltage signal, that is, an output voltage $V_{OUT}$, $V_{OUT}=I_f \times R_f$. As described above, A photo diode which can generate the photo current $I_{PD}$ in response to the optical signal (laser beam or light) inputted to the photo diode, can be used as the photo detector 12.

A differential amplifier G1, an emitter follower G2, and the output buffer G3 constitute a trans-impedance amplifier 10 to transmit an input impedance as an output.

When the photo signal is too intense during a writing operation of writing information on a recording medium, such as a CD-RW, in a disc recording and/or reading apparatus, the trans-impedance amplifier 10 becomes saturated to be out of an operation range. Due to this, the output voltage $V_{OUT}$ is not increased even if the FD current $I_f$ increases, thereby decreasing a speed of an amplifier in response to a small amount of the photo signal and distorting an over-response characteristic of the amplifier.

The differential amplifier G1 outputs an output calculated by multiplying a difference between two input signals inputted into input terminals of the differential amplifier G1 by a predetermined gain. In the differential amplifier G1, a gain may be ideally an indefinite gain, and an input voltage of at least one of the inputs is 0. However, the gain is actually a definite gain, and the input voltage is not actually 0. Therefore, a non-inverter input of the differential amplifier 10 is connected to the feedback resistor to make the input voltage 0. Instead of the differential amplifier G1 as shown in FIG. 2, another type of an amplifier receiving a voltage generated according to the photo current generated from the photo detector 12 can be used.

In the emitter follower or a collector-common amplifier G2, an input is inputted into a base of the emitter follower G2, and an output is obtained from an emitter of the emitter follower G2. The emitter follower G2 maintains a voltage gain when an input resistance is far greater than an output resistance, while outputting the input as the output. Since a gain between the base and the emitter of the emitter follower G2 is almost 1, the emitter follower G2 outputs the input of the base through the emitter as the output.

The output buffer G3 maintains a current gain to output an input as an output when an input impedance is far greater than an output impedance. A gain of the output buffer G3 is the same as the emitter follower G2.

The feedback resistance $R_f$ of the feedback resistor functions such that the photo current $I_{PD}$ generated from the photo detector 12 and inputted as an input of the trans-impedance amplifier 10 is converted into an output voltage $V_{OUT}$ as an output of the trans-impedance amplifier 10.

The current detecting limiter unit 11 receives an output current $I_{SENSE}$ of the differential amplifier G1 of the trans-impedance amplifier 10 as an input, and is turned on when the output current $I_{SENSE}$ is greater than a predetermined value to transmit a current $I_{LMTIN}$ as a current $I_{LMTOUT}$ to a terminal $T_{in}$, a junction between the photo detector 12 and the differential amplifier G1.

Since the photo current $I_{PD}$ is $I_f + I_{LMTIN}$, the feedback current $I_f$ is controlled not to be increased over a predetermined value since the current $I_{LMTIN}$ is inputted to the terminal $T_{in}$ as a current $I_{LMTOUT}$ even if the photo current $I_{PD}$ is excessively increased in response to an increase of the intense (excess) photo signal $I_{PD}$, thereby preventing the saturation of the trans-impedance amplifier 10.

Figure 3:
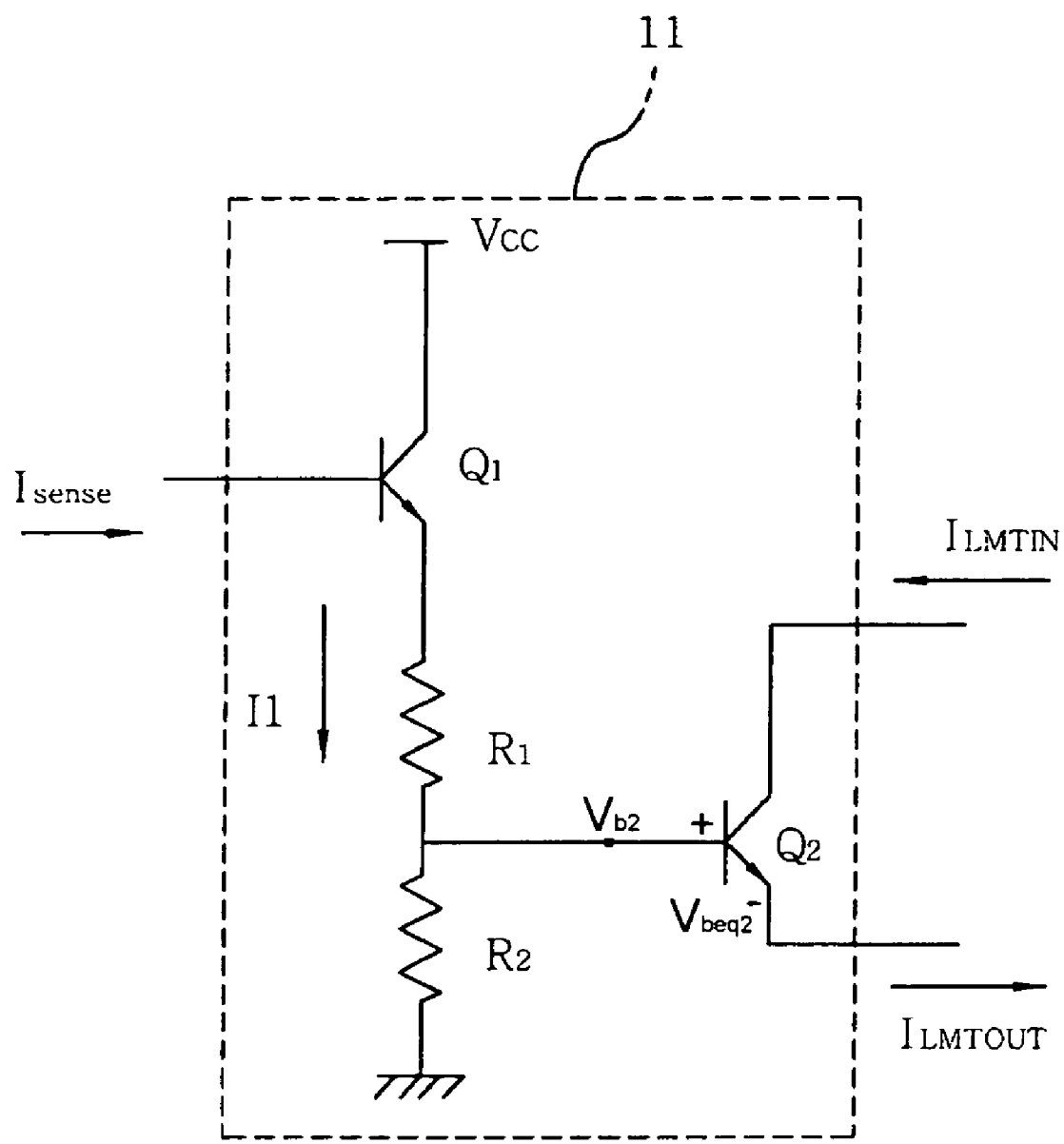
FIG. 3 is a circuit diagram showing a current-detecting limiter unit of the current-voltage transforming circuit shown in FIG. 2.

FIG. 3 is a circuit diagram showing the current-detecting limiter unit 11 of the current-voltage transforming circuit 10 shown in FIG. 2.

The current-detecting limiter unit 11 includes first, second, and third terminals for currents $I_{SENSE}$, $I_{LMTIN}$, and $I_{LMTOUT}$, respectively. First and second resistors R1 and R2 are connected between the first transistor Q1 and a second transistor Q2 and between the first resistor R1 and a reference potential (voltage) signal $V_{REF}$ or a ground, respectively. When the current $I_{SENSE}$ I is supplied from the differential amplifier G1 to the current-detecting limiter unit 11 through the first terminal, a current I1 flows through the first transistor Q1. If an amplification coefficient of the first transistor Q1 is β, the current I1 is calculated by the following formula.

$$I1 = \beta \times I_{SENSE}$$

A base voltage $V_{b2}$ of the second transistor Q2 is calculated by the following formula.

$$V_{b2} = I1 \times R_2$$

When $V_{b2} > V_{REF} + V_{beq2}$, which is about 0.7V, the second transistor Q2 is turned on to activate the current-detecting limiter unit 11 to output the current $I_{LMTOUT}$ to the terminal $T_{in}$. Here, the voltage $V_{beq2}$ is a voltage between a base and an emitter of the second transistor Q2. Therefore, the trans-impedance amplifier 10 is not saturated even if the photo current $I_{PD}$ is increased generated from the photo detector 12 during the writing operation of writing the information on the recording medium, such as the CD-RW, etc, in the disc recording and/or reading apparatus.

Figure 4:
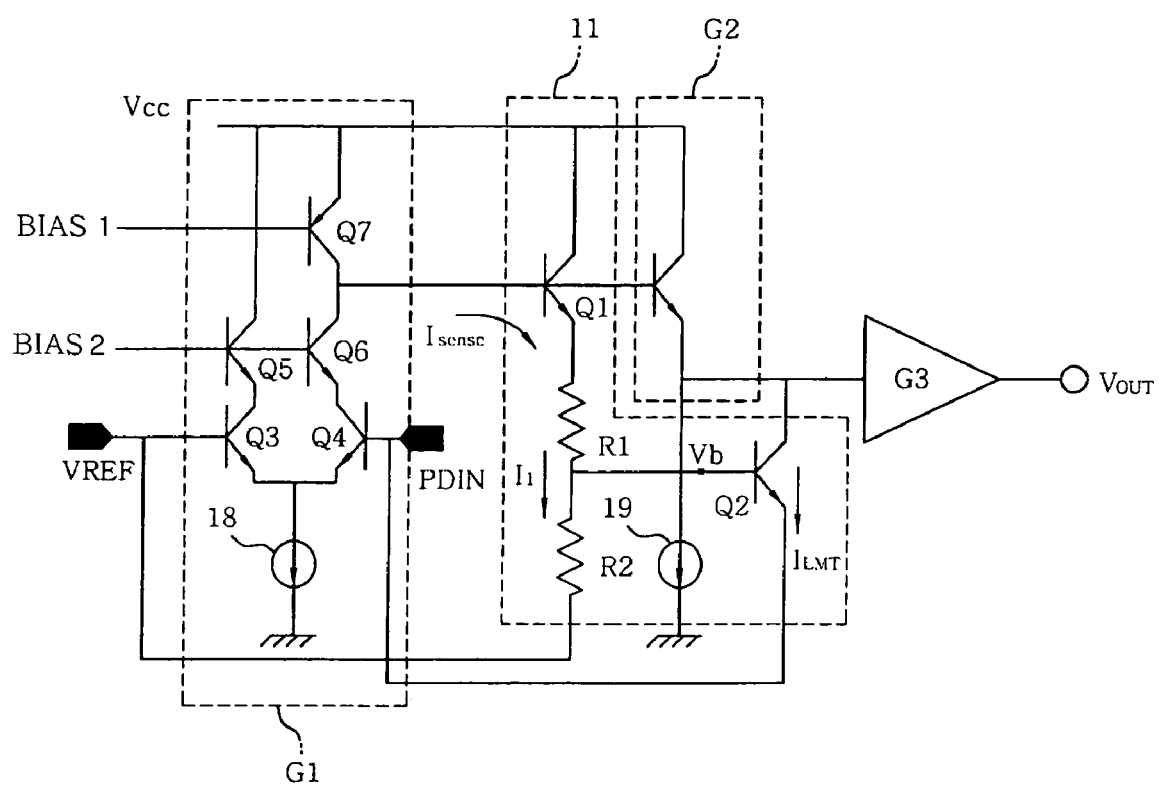
FIG. 4 is a circuit diagram showing a differential amplifier and an emitter follower of a trans-impedance amplifier, and the current-detecting limiter unit of the current-voltage transforming circuit shown in FIG. 2.

FIG. 4 is a circuit diagram showing operations of the differential amplifier G1 and the emitter follower G2 of the trans-impedance amplifier 10, and the current detecting limiter unit 11 of the current-voltage transforming circuit shown in FIG. 2.

The differential amplifier G1 includes third, fourth, fifth, sixth, seventh transistors Q3, Q4, Q5, Q6, and Q7 to output a value calculated by multiplying a difference between a signal PDIN and a reference potential VREF inputted through respective terminals by a predetermined gain.

The signal is VREF is inputted into a base of the third transistor Q3, and the signal PDIN is inputted into a base of the fourth transistor Q4. Referring to FIGS. 2 and 4, the base of the third transistor Q3 corresponds to a non-inverting terminal of the differential amplifier G1 to receive the reference potential VREF, and the base of the fourth transistor Q4 corresponds to an inverting terminal of the differential amplifier G1.

When the signal PDIN is inputted to the differential amplifier G1 as an input, the current $I_{SENSE}$ is transmitted to the base of the first transistor Q1 of the current detecting limiter unit 11 through a junction between a collector of the sixth transistor Q6 and a collector of the seventh transistor Q7.

In the current detecting limiter unit 11, the current $I_{SENSE}$ is increased when the current of the signal PDIN is increased. Accordingly, the current I1 is increased, and a voltage between the first and second resistor R1 and R2, that is, the base voltage $V_{b2}$, is increased. When $V_{b2} > V_{REF} + V_{beq2}$ (about 0.7V), the second transistor Q2 is turned on to supply the limiter current $I_{LMT}$ to the terminal $T_{in}$. When an input current of the trans-impedance amplifier 10 is increased since the limiter current $I_{LMT}$ flows to the terminal $T_{in}$, the saturation of the trans-impedance amplifier 10 is prevented since the feedback current $I_f$ is limited. The current detecting limiter unit 11 is biased due to a constant current source 18. An output of the emitter of the emitter follower G2 is transmitted to the output buffer G3.

The third, fourth, fifth, sixth, seventh transistors Q3, Q4, Q5, Q6, and Q7 of the differential amplifier G1 correspond to a pair of differential transistors Q3 and Q4, active loads Q5 and Q6, and a Wilson current mirror Q7, respectively.

The third and fourth transistor Q3 and Q4 are connected through collectors thereof and are biased by the constant current source 18.

A bias 1 and a bias 2 are supplied to correspond to a current source and an active load of the third and fourth transistors Q3 and Q4, respectively. The bias 1 is supplied to the seventh transistor Q7, and the bias 2 is supplied to the fifth and sixth transistor Q5 and Q6.

The seventh transistor Q7 corresponding to the bias 1 includes the Wilson current mirror having a PNP type transistor and excluding a self-biased circuit, and functions as the active load and the current source of the third and fourth transistor Q3 and Q4.

Since gains of the sixth and seventh transistor Q6 and Q7 is proportional to respective output impedances $R_0$, that is, $G = g_m \times Ro$, a larger gain can be obtained according to a larger output impedances of the sixth and seventh transistor Q6 and Q7.

Figure 5:
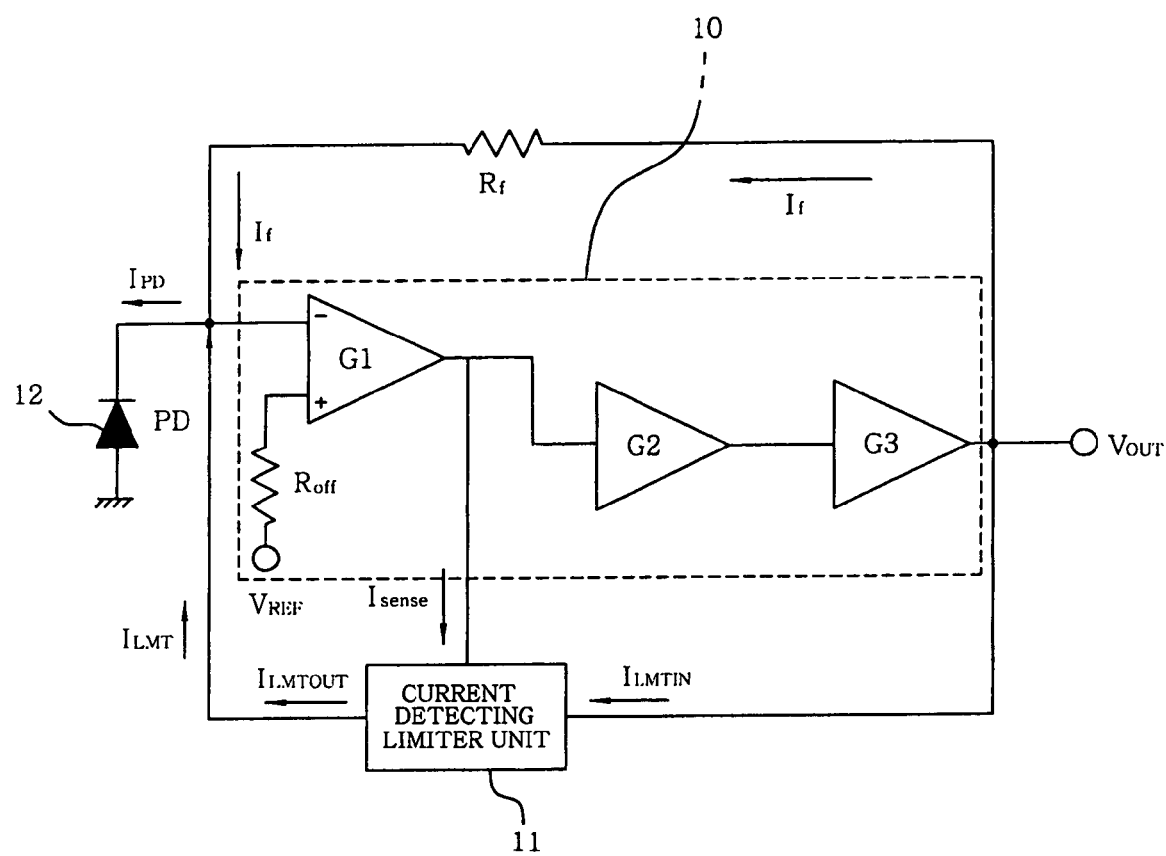
FIG. 5 is a block diagram showing a current-voltage transforming circuit having a limiter circuit used with a photo detector integrated circuit according to another embodiment of the present invention.

FIG. 5 is a block diagram showing another current-voltage transforming circuit 10 and another current detecting limiter unit 11 used with the photo detector integrated circuit according to another embodiment of the present invention.

As shown in FIGS. 2 and 5, the photo detector 12 generates the photo current $I_{PD}$ in response to the photo signal, such as the laser beam (light), inputted to the photo detector 12. The photo current $I_{PD}$ pulls the feedback (FB) current $I_f$ from the output buffer G3. When the FD current $I_f$ flows through the feedback resistor having the resistance of $R_f$, the voltage difference is generated between the both ends of the feed back resistor so that the FD current $I_f$ is converted into the voltage signal, that is, the output voltage $V_{OUT}$, $V_{OUT} = I_f \times R_f$. The converted output voltage is outputted through the differential amplifier G1, the emitter follower G2, and the output buffer G3. The structures of the differential amplifier G1, the emitter follower G2, and the output buffer G3 are the same as shown in FIG. 4.

In this embodiment shown in FIG. 5, the limiter current $I_{LMT}$ is transmitted to the terminal Tin from an output terminal of the output buffer G3 rather than an output terminal of the emitter follower G2 of FIG. 2 according to the current $I_{SENSE}$. When the limiter current $I_{LMT}$ flows into an input terminal of the trans-impedance amplifier 10, the feedback current $I_f$ of the trans-impedance amplifier 10 is limited to prevent the saturation of the trans-impedance amplifier 10. An effect of the prevention of the saturation in the trans-impedance amplifier 10 shown in FIG, 5 is the same as the trans-impedance amplifier 10 shown in FIG. 2.

Figure 6:
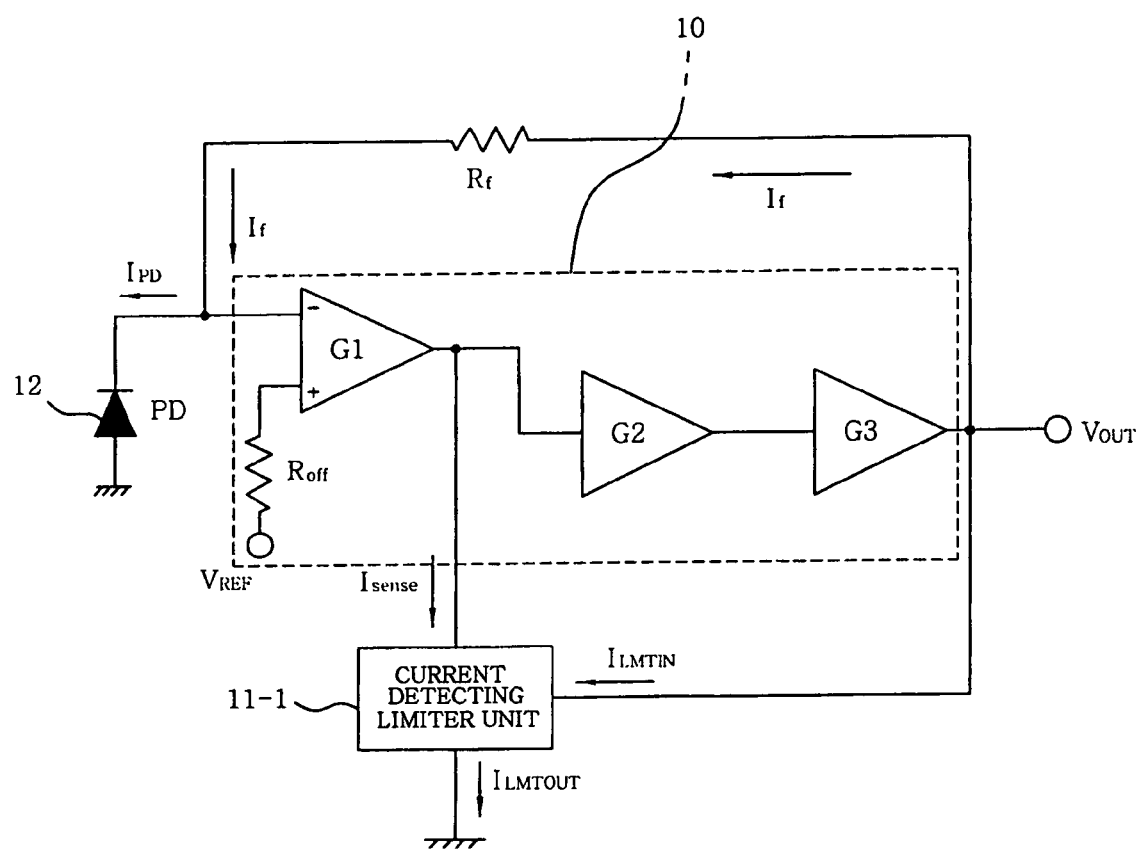
FIG. 6 is a block diagram showing a current-voltage transforming circuit having a limiter circuit used with the photo detector integrated circuit according to another embodiment of the present invention.

FIG. 6 is a block diagram showing another current-voltage transforming circuit 10 and another current detecting limiter unit 11-1 used with the photo detector integrated circuit according to another embodiment of the present invention.

As shown in FIGS. 2 and 6, the current $I_{SENSE}$ flows from an output terminal of the differential amplifier G1 to the current detecting limiter unit 11-1, and the current detecting limiter unit 11-1 generates the limiter current $I_{LMT}$ when the current $I_{SENSE}$ is greater than a predetermined value, so that saturation of the current-voltage transforming circuit 10 is prevented by limiting the feedback current $I_f$ of the current-voltage transforming circuit 10.

In FIG. 6, an output terminal of the current detecting limiter unit 11-1 is connected to the ground or another reference potential rather than the terminal $T_{in}$ which is shown in FIG. 2.

Figure 7:
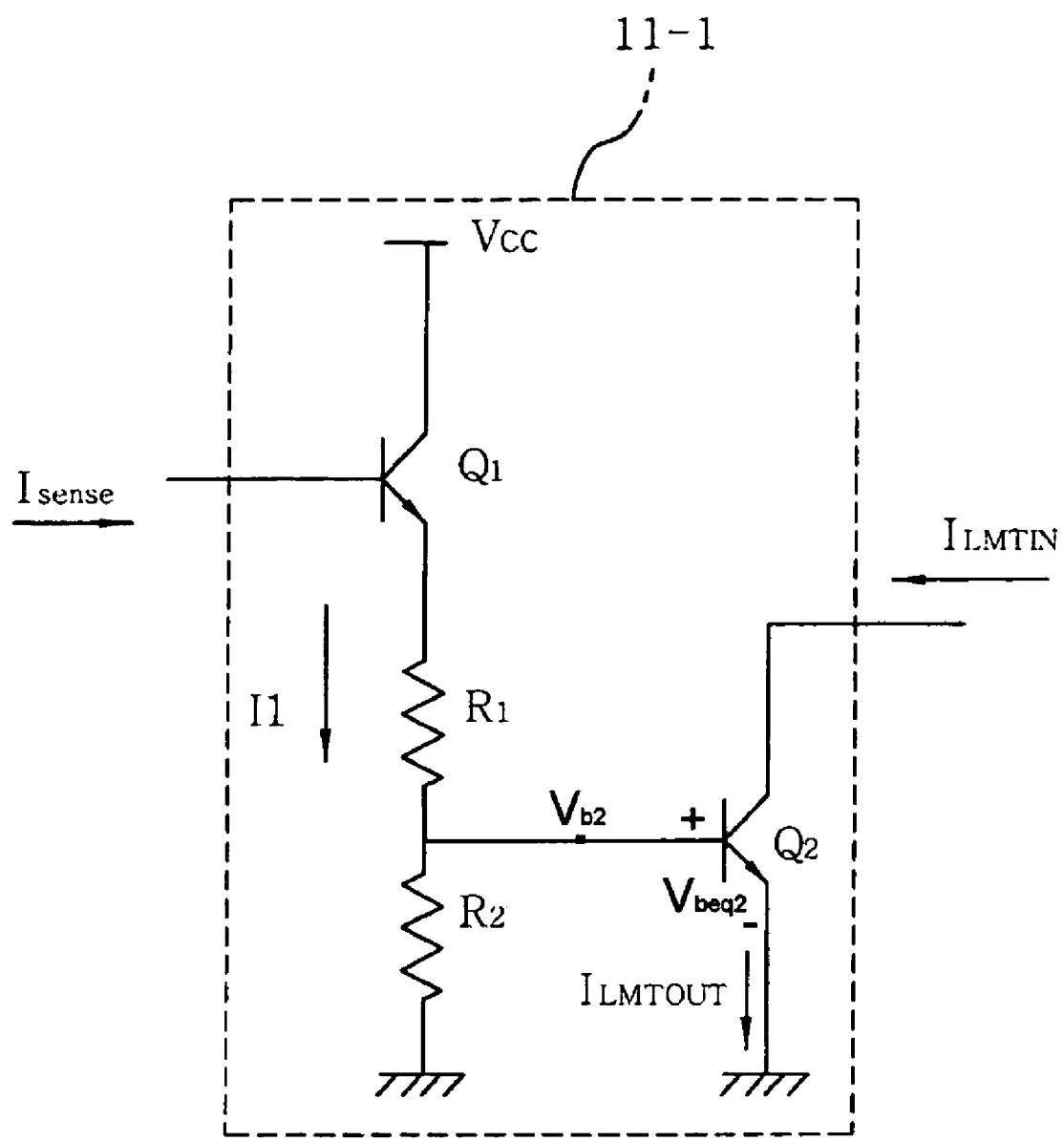
FIG. 7 is a circuit diagram showing a current-detecting limiter unit of the current-voltage transforming circuit shown in FIG. 6.

FIG. 7 is a circuit diagram showing the current-detecting limiter unit 11-1 of the current-voltage transforming circuit shown in FIG. 6;

The current $I_{SENSE}$ flows through the differential amplifier G1, and then the first transistor Q1 is turned on. If the amplification coefficient of the first transistor Q1 is β, the current I1 is calculated by the following formula.

$$I1 = \beta \times I_{SENSE}$$

The base voltage $V_{b2}$ of the second transistor Q2 is calculated by the following formula.

$$V_{b2} = I1 \times R_2$$

When $V_{b2} > V_{REF} + V_{beq2}$, which is about 0.7V, the second transistor Q2 is turned on to activate the current-detecting limiter unit 11 to generate the current $I_{LMTOUT}$. Here, the voltage $V_{beq2}$ is a voltage between a base and an emitter of the second transistor Q2, and the voltage $V_{REF}$ is a reference voltage inputted into a non-inverter terminal of the differential amplifier G1. Therefore, the trans-impedance amplifier 10 is not saturated even if the photo current $I_{PD}$ is increased generated from the photo detector 12 during the writing operation of writing the information on the recording medium in the disc recording and/or reading apparatus. The structure of the current detecting limiter unit 11-1 according to this embodiment of the present invention shown in FIG. 6 is the same as the current detecting limiter unit 11 of FIG. 3. However, the only difference between the current detecting limiter unit 11 and the current detecting limiter unit 11-1 is that the output terminal of the current detecting limiter unit 11-1, that is, an emitter of the second transistor Q2, is connected to the ground or the potential so that the limiter current $I_{LMT}$ flows through the ground or the reference potential.

Figure 8:
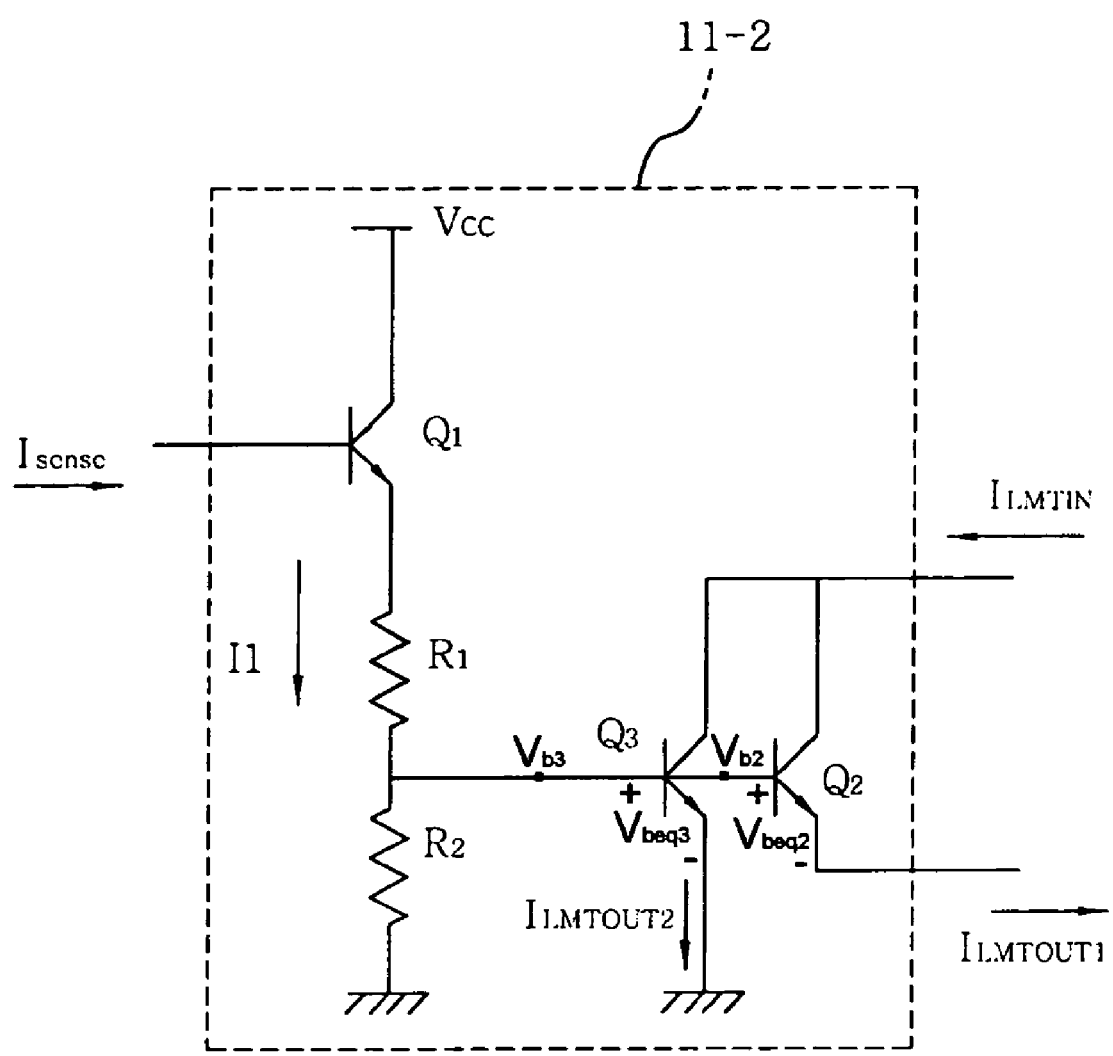
FIG. 8 is a circuit diagram showing another current-detecting limiter unit of the current-voltage transforming circuit shown in FIG. 6.

FIG. 8 is a circuit diagram showing another current detecting limiter unit 11-2 of the current-voltage transforming circuit shown in FIG. 6. the current detecting limiter unit 11-2 can be used in the current-voltage transforming circuit shown in FIGS. 2 and 5.

The current detecting limiter unit 11-2 of FIG. 8 is a combination of the current detecting limiter unit 11 of FIG. 3 and the current detecting limiter unit 11-1 of FIG. 7. The current $I_{SENSE}$ is supplied from the differential amplifier G1, the current I1 flows through the first transistor Q1. If the amplification coefficient of the first transistor Q1 is β, the current I1 is calculated by the following formula.

$$I1 = \beta \times I_{SENSE}$$

A base voltage $V_{b2}$ of the second transistor Q2 and a base voltage $V_{b3}$ of an eighth transistor Q8 are respectively calculated by the following formula.

$$V_{b2}(=V_{b3}) = I1 \times R2$$

When $V_{b2}$ ($V_{b3}$) > $V_{REF} + V_{beq2}$ (= $V_{beq3}$) (about 0.7V), the second and eighth transistors Q2 and Q8 are turned on to activate the current detecting limiter unit 11-2 to generate the current $I_{LMT}$. The current $I_{LMTIN}$ flows through the second and eighth transistors Q2 and Q8 as the currents $I_{LMTOUT1}$ and $I_{LMTOUT2}$, respectively. The current $I_{LMTOUT1}$ flows through the ground, and the current $I_{LMTOUT2}$ flows into the terminal $T_{in}$. Accordingly, the feedback current $I_f$ of the trans-impedance amplifier 10 is limited to prevent, the saturation. Here, $V_{beq2}$ and $V_{beq3}$ are emitter-base voltages of the second and eighth transistors Q2 and Q8, and the voltage $V_{REF}$ is a reference voltage inputted into a non-inverter terminal of the differential amplifier G1.

Figure 9:
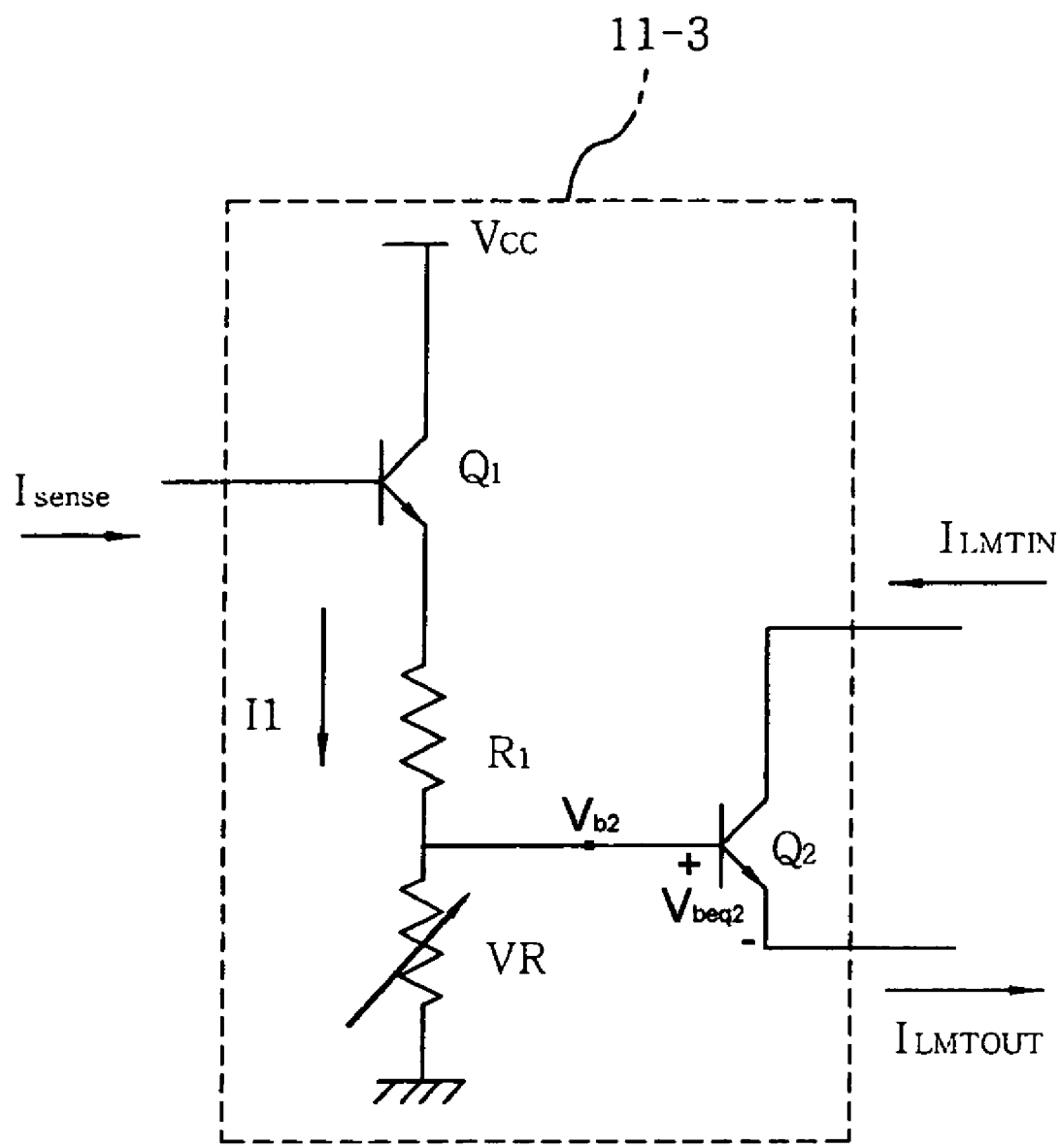
FIG. 9 is a circuit diagram showing another current-detecting limiter unit of the current-voltage transforming circuit shown in FIG. 6.

FIG. 9 is a circuit diagram showing another current detecting limiter unit 11-3 of the current-voltage transforming circuit. The current detecting limiter unit 11-3 can be used in the current-voltage transforming circuit shown in FIGS. 2 and 5.

In the current detecting limiter unit 11-3 according to this embodiment, the second resistor R2 is replaced with a variable resistor VR to selectively adjust the amplitude of an output of the current detecting limiter unit 11-3 which can be used to limit the feedback current $I_f$ according to a user demand.

The base voltage $V_{b2}$ of the second transistor Q2 of FIG. 9 is calculated using the following formula.

$$V_{b2} = I1 \times VR$$

When $V_{b2} > V_{REF} + V_{beq2}$ (about 0.7V), the second transistor Q2 is turned on to activate the current detecting limiter unit 11-3 to generate the current $I_{LMT}$. Here, $V_{beq2}$ is the emitter-base voltage of the second transistor Q2, and the voltage $V_{REF}$ is a reference voltage inputted into the non-inverting terminal of the differential amplifier G1. According to this structure of the current detecting limiter unit 11-3, the trans-impedance amplifier 10 is not saturated even if the photo current $I_{PD}$ is increased during the writing operation of writing the information on a recording medium, such as the CD-RW, in the disc recording and/or reading apparatus.

The second resistor R2 of the current detecting limiter units 11-1 and 11-2 shown in FIGS. 7 and 8, respectively, can be replaced with the variable resistor VR shown in FIG. 9 to selectively adjust the output of the current detecting limiter units 11-1 and 11-2.

Figure 10:
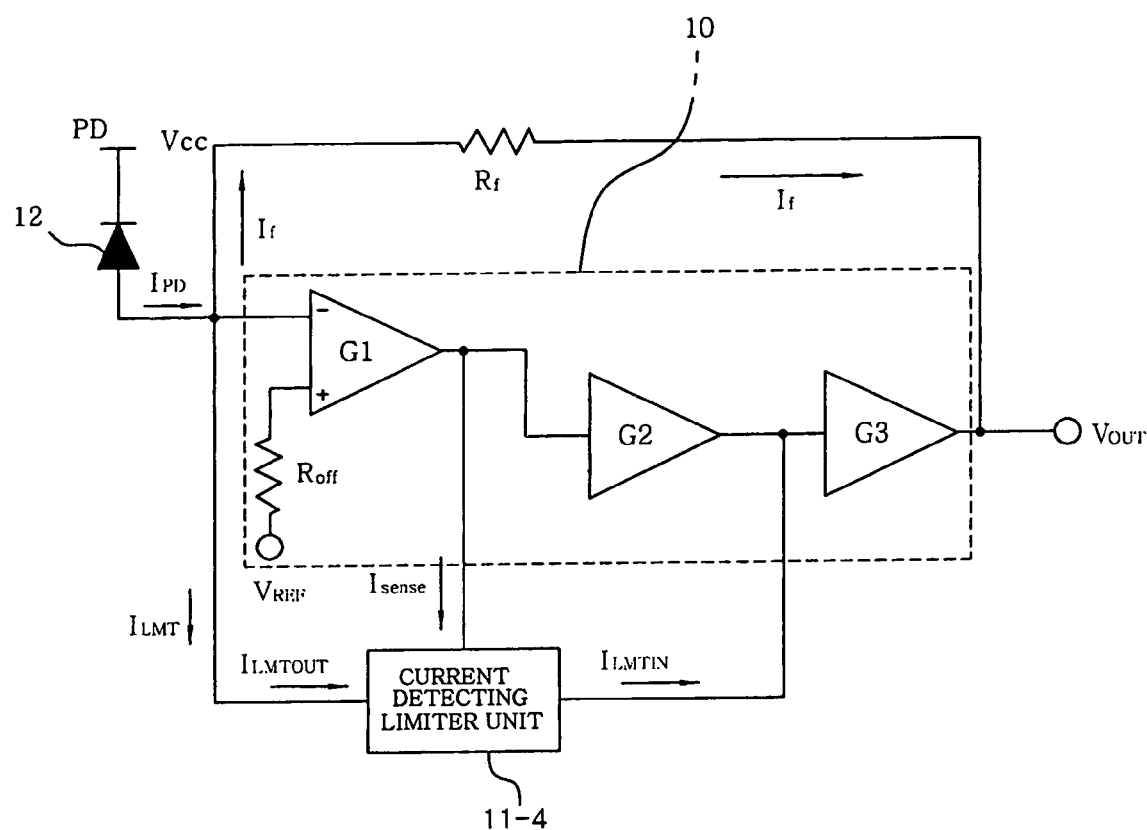
FIG. 10 is a block diagram showing a current-voltage transforming circuit having a limiter circuit used with the photo detector integrated circuit according to another embodiment of the present invention.

FIG. 10 is a block diagram showing a current-voltage transforming circuit 10 having a current detecting limiter unit 11-4 used with the photo detector integrated circuit according to another embodiment of the present invention. As opposed to previous embodiments, the current-voltage transforming circuit includes at least one PNP type transistor.

As shown in FIG. 10, when the transistor elements are realized by the PNP type transistor, a current direction of the photo diode 12 is changed (reversed), and a direction of the current $I_{LMT}$ of the current detecting limiter unit 11-4 becomes changed (reversed).

Figure 11:
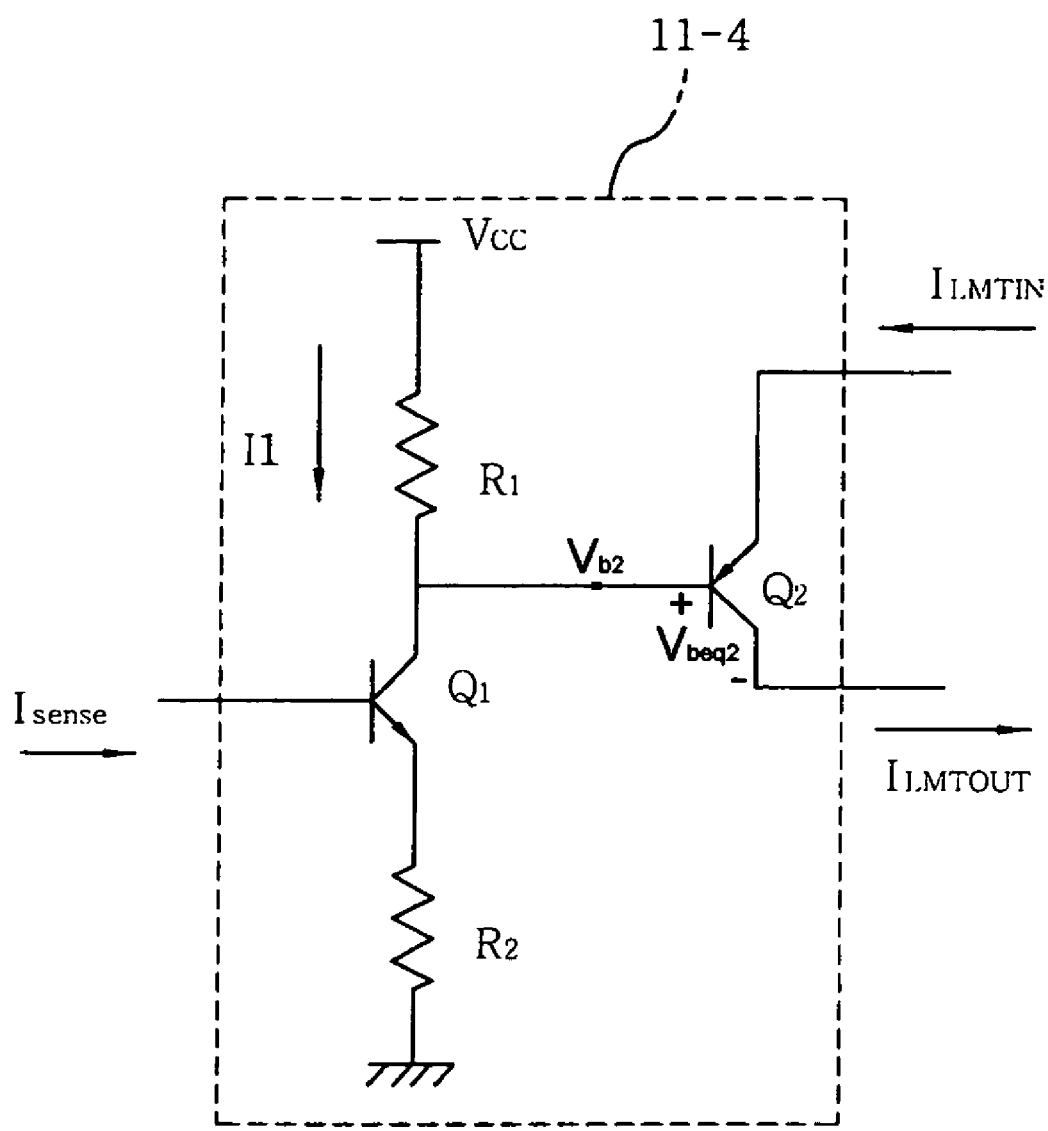
FIG. 11 is a circuit diagram showing a current-detecting limiter unit of the current-voltage transforming circuit shown in FIG. 10.

FIG. 11 is a circuit diagram showing another current detecting limiter unit 11-4 of the current-voltage transforming circuit. The current detecting limiter unit 11-4 can be used in the current-voltage transforming circuit shown in FIGS. 2 and 5.

The current $I_{SENSE}$ flows through the differential amplifier G1, and then the first transistor Q1 is turned on. If the amplification coefficient of the first transistor Q1 is β, the current I1 is calculated by the following formula.

$$I1 = \beta \times I_{SENSE}$$

The base voltage $V_{b2}$ of the second transistor Q2 is calculated by the following formula.

$$V_{b2} = V_{CC} - I1 \times R_1$$

When $V_{b2} < V_{CC} - I1 \times R_1$ (about 0.7V), the second transistor Q2 is turned on to activate the current detecting limiter unit 11-4 to generate the current $I_{LMT}$. Here, the voltage $V_{beq2}$ is a voltage between a base and an emitter of the second transistor Q2, and the voltage $V_{REF}$ is a reference voltage inputted into a non-inverter terminal of the differential amplifier G1. Therefore, the trans-impedance amplifier 10 is not saturated even if the photo current $I_{PD}$ is increased generated from the photo detector 12 during the writing operation of writing the information on the recording medium, such as the CD-RW, in the disc recording and/or reading apparatus.

It is possible that the output current $I_{LMTOUT}$ of the current detecting limit unit 11-4 of FIG. 11 is controlled to flow through the ground like as the current detecting limit unit shown in FIG. 7. It is also possible that the output current $I_{LMTOUT}$ of the current detecting limit unit 11-4 of FIG. 11 is controlled to divide the output current into the current $I_{LMTOUT1}$ and $I_{LMTOUT2}$ to be transmitted to the ground and the terminal $T_{in}$, respectively, like as the current detecting limit unit shown in FIG. 8.

Figure 12:
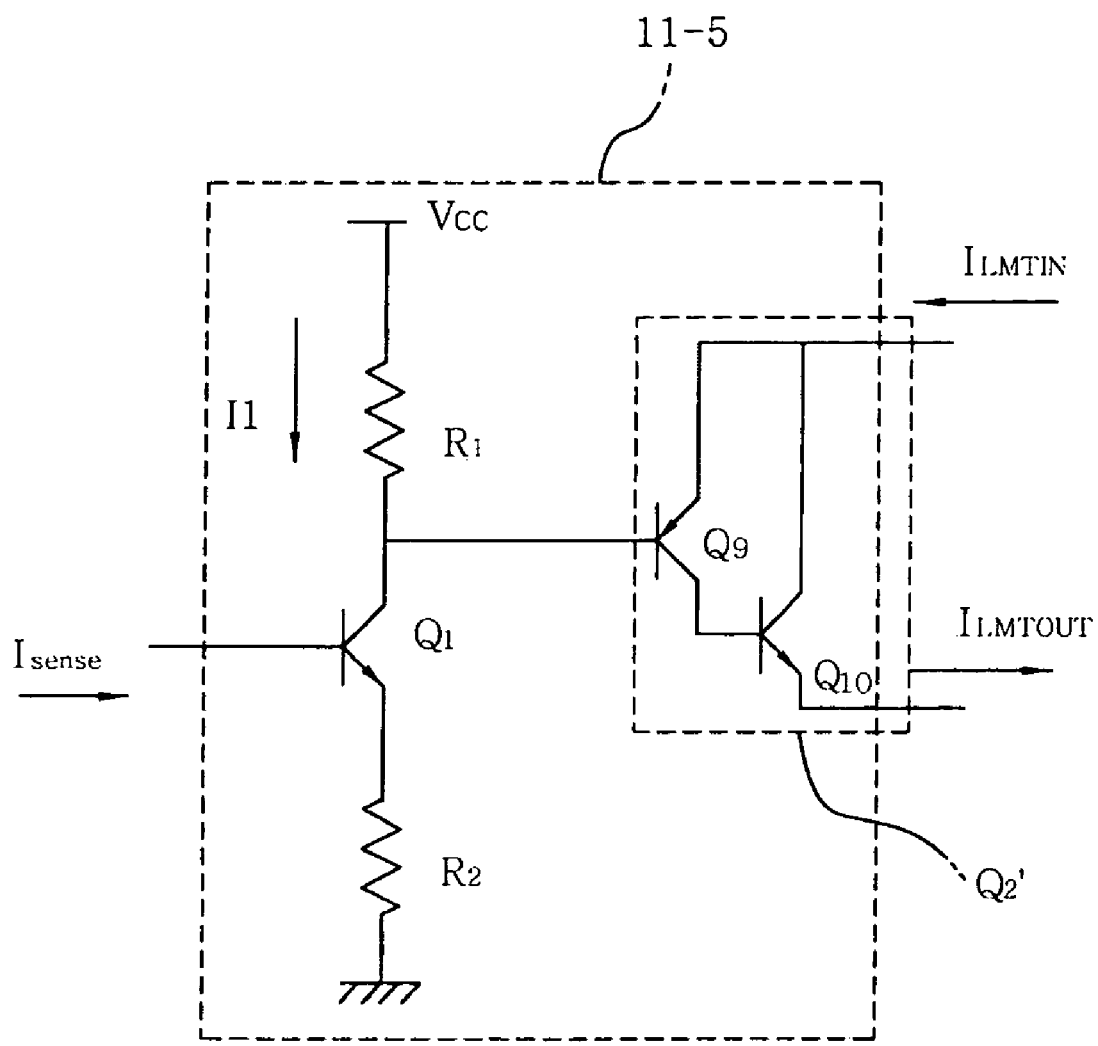
FIG. 12 is a circuit diagram showing another current-detecting limiter unit using a PNP type transistor having a high amplification constant β in the current-voltage transforming circuit shown in FIG. 10.

FIG. 12 is a circuit diagram showing another current detecting limiter unit 11-5 of the current-voltage transforming circuit. The current detecting limiter unit 11-5 can be used in the current-voltage transforming circuit shown in FIGS. 2 and 5.

The current detecting limiter unit 11-5 of FIG. 12 includes a ninth transistor Q9 of the PNP type transistor, which is shown in the current detecting limiter unit 11-4 of FIG.11, and a tenth transistor Q10 of the NPN type transistor. A base terminal of the tenth transistor Q10 is connected to a collector terminal of the ninth transistor Q9, a collector terminal of the tenth transistor Q10 is connected to an emitter terminal of the ninth transistor Q9, and an emitter terminal of the tenth transistor Q10 is an output terminal of the current detecting limiter unit 11-5 to output the current $I_{LMTOUT}$.

The ninth and tenth transistors Q9 an dQ10 of FIG. 12 forms an equivalent circuit of the second transistor Q2 of FIG. 11 to perform the same switching function as the second transistor Q2 of FIG. 11. However, a coupling state in which the tenth transistor Q10 and the ninth transistor Q9 having the same equivalent circuit as a single PNP type transistor, has a higher amplification coefficient β' than the single PNP transistor since the amplification coefficient β' is calculated by multiplying a second amplification coefficient $β_2$ of the ninth transistor Q9 by a third amplification coefficient $β_3$ of the tenth transistor Q10.

In the PNP type transistor, the amplification coefficient β is lower to slow the speed compared to the NPN type transistor. The amplification coefficient β can be increased using a coupling structure of the PNP type transistor and the NPN type transistor as shown in FIG. 12. Although the coupling structure of the PNP type transistor and the NPN type transistor includes the PNP type transistor, the coupling structure of the PNP type transistor and the NPN type transistor is used in the current-voltage transforming circuit having the amplification coefficient β greater than the circuit constituted of the PNP type transistor and same speed as the circuit constituted of the NPN type transistor.

Figure 13:
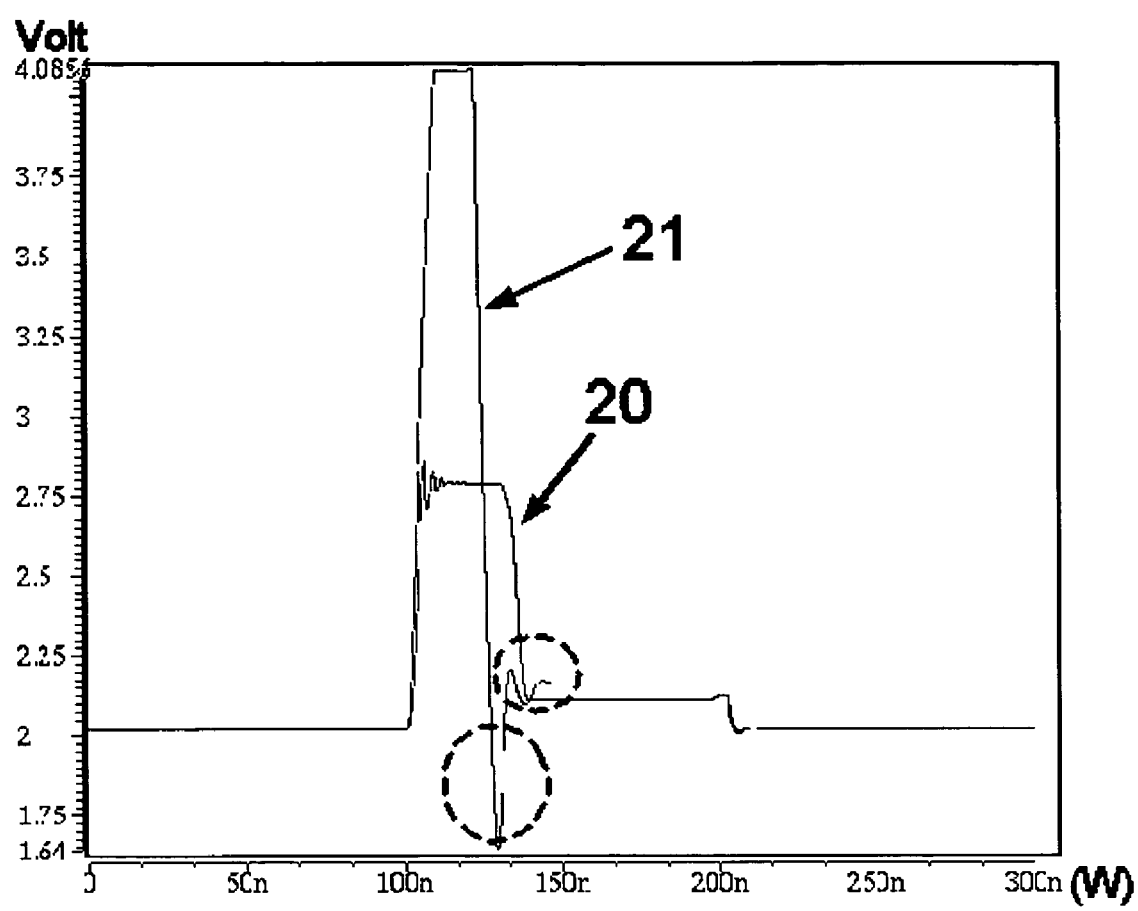
FIG. 13 is a view showing an over-response characteristic of an output of the current-voltage transforming circuit according to an optical strength of a laser beam (light) inputted to the current-voltage transforming circuit employing the current-detecting limiter unit.

FIG. 13 is a view showing an over-response characteristic of an output of the current-voltage transforming circuit according to an optical strength of a laser beam (light) inputted to the current-voltage transforming circuit employing the current-detecting limiter unit.

A graph 20 is the over-response characteristic of the output of the current-voltage transforming circuit according to the embodiments of the present invention, and another graph 21 is the over-response characteristic of the output of a conventional current-voltage transforming circuit which does not use the embodiments of the present invention.

In the conventional current-voltage transforming circuit, when the laser beam becomes being weakened, an output voltage indicated with a circular broken line of the graph 21 is lowered too much. However, in the current-voltage transforming circuit according to the embodiments of the present invention, a change of the output voltage is limited in a predetermined range as indicated with another circular broken line of graph 20, thereby stabilizing the output voltage.

According to the current-voltage transforming circuit used with the PDIC, since the current is detected rather than the voltage of the trans-impedance amplifier, the saturation of the current-voltage transforming circuit can be prevented using the limiter current.

The current-voltage transforming circuit used with the PDIC is provided with NPN type transistor.

According to the current-voltage transforming circuit used with the PDIC, the current of the current detecting limiter unit can be switched by detecting the current of the current-voltage transforming circuit regardless of the maximum or minimum value of the voltage of the current-voltage transforming circuit, thereby obtaining an improved current-voltage transforming circuit used with the PDIC having the higher gain and speed.

According to the current-voltage transforming circuit used with the PDIC, a current turning-on point of the current detecting limiter unit can be adjusted by a user.

According to the current-voltage transforming circuit used with the PDIC, the limiter current flows through the trans-impedance amplifier to prevent the saturation of the trans-impedance amplifier, thereby improving the over-response characteristic of an RF wave as well as a signal to noise ratio in the current-voltage transforming circuit used with the PDIC.

According to the above embodiments of the present invention, the current-voltage transforming circuit used with the PDIC can be employed in the disc recording and/or reading apparatus.

Although a few preferred embodiments of the present invention have been shown and described, it would be appreciated by those skilled in the art that changes may be made in this embodiment without departing from the principle and sprit of the invention, the scope of which is defined in the claims and their equivalent.

What is claimed is:

1. A current-voltage transforming circuit comprising:
   a photo detector generating a photo current in response to a photo signal inputted into the photo detector;
   an amplifier amplifying the photo current received from the photo detector;
   an emitter follower coupled to the amplifier;
   an output buffer coupled to the emitter follower;
   a current detecting limiter unit having an input terminal and an output terminal to output a limiter current when an output current of the amplifier is greater than a predetermined reference value; and
   a feedback resistor coupled between the input of said amplifier and the output of said output buffer;
   wherein the input terminal of the current detecting limiter unit is coupled to a junction between the emitter follower and the output buffer.

2. The circuit of claim 1, wherein the output terminal of the current detecting limiter unit is coupled to an input of the amplifier.

3. A current-voltage transforming circuit comprising:
   a photo detector generating a photo current in response to a photo signal inputted into the photo detector;
   an amplifier amplifying the photo current received from the photo detector;
   an emitter follower coupled to the amplifier;
   an output buffer coupled to the emitter follower;
   a current detecting limiter unit having an input terminal and an output terminal to output a limiter current when an output current of the amplifier is greater than a predetermined reference value;
   a feedback resistor coupled between the input of said amplifier and the output of said output buffer; and
   wherein the amplifier comprises receiving an input voltage of the photo current generated from the photo detector and a reference voltage.

4. The circuit of claim 3, wherein the differential amplifier comprises a pair of differential transistors and first and second biases supplied to the differential transistors.

5. A current-voltage transforming circuit comprising:
   a photo detector generating a photo current in response to a photo signal inputted into the photo detector;
   an amplifier amplifying the photo current received from the photo detector;
   an emitter follower coupled to the amplifier;
   an output buffer coupled to the emitter follower;
   a current detecting limiter unit having an input terminal and an output terminal to output a limiter current when an output current of the amplifier is greater than a predetermined reference value; and
   a feedback resistor coupled between the input of said amplifier and the output of said output buffer;
   wherein said current limiter unit includes
   a voltage source;
   first and second resistors;
   a first transistor having collector coupled to the voltage source, a base receiving the output current from the amplifier, and an emitter coupled to the first and second resistors; and a second transistor having a collector coupled to receive a current from one of the emitter follower and the output buffer, an emitter coupled to output the limiter current, and a base coupled to a junction between the first and second resistors.

6. The circuit of claim 5, wherein the first and second transistors comprise:
an NPN type transistor.

7. The circuit of claim 5, wherein the second transistor is turned on when $V_{b2} > V_{REF} + V_{beq2}$ where $V_{b2}$ is a voltage of the junction, $V_{REF}$ is a reference voltage, and $V_{beq2}$ is a base and emitter voltage of the second transistor.

8. A current-voltage transforming circuit comprising:
a photo detector generating a photo current in response to a photo signal inputted into the photo detector;
an amplifier amplifying the photo current received from the photo detector;
an emitter follower coupled to the amplifier;
an output buffer coupled to the emitter follower;
a current detecting limiter unit having an input terminal and an output terminal to output a limiter current when an output current of the amplifier is greater than a predetermined reference value; and
a feedback resistor coupled between the input of said amplifier and the output of said output buffer;
wherein the output terminal of the current detecting limiter unit includes:
first and second sub-output terminals coupled to the amplifier and ground, respectively; and
wherein the current detecting limiter unit comprises:
a voltage source;
first and second resistors;
a first transistor having collector coupled to the voltage source, a base receiving the output current from the amplifier, and an emitter coupled to the first and second resistors; and
a second transistor having a collector coupled to receive a current from one of the emitter follower and the output buffer, an emitter coupled to the first sub-output terminal, and a base coupled to a junction between the first and second resistors.

9. The circuit of claim 8, wherein the current detecting limiter unit further comprises:
a third transistor having a collector coupled to receive the current from one of the emitter follower and the output buffer, an emitter coupled to the second sub-output terminal, and a base coupled to a junction between the first and second resistors.

10. The circuit of claim 8 wherein the second resistor comprises:
a variable resistor.

11. A current-voltage transforming circuit comprising:
a photo detector generating a photo current in response to a photo signal inputted into the photo detector;
an amplifier amplifying the photo current received from the photo detector;
an emitter follower coupled to the amplifier;
an output buffer coupled to the emitter follower;
a current detecting limiter unit having an input terminal and an output terminal to output a limiter current when an output current of the amplifier is greater than a predetermined reference value; and
a feedback resistor coupled between the input of said amplifier and the output of said output buffer;
wherein the current detecting limiter unit includes:
a voltage source;
first and second resistors;
a first transistor having collector coupled to the voltage source and the first resistor, an emitter coupled to ground and the second resistor, and a base coupled to receive output from the amplifier; and
a second transistor having an emitter to receive a current from one of the emitter follower and the output buffer, a collector coupled to output the limiter current, and a base coupled to a junction between the first resistor and the first transistor.

12. The circuit of claim 11, wherein the first transistor comprises an NPN type transistor, and the second transistor comprises a PNP type transistor.

13. The circuit of claim 11, wherein the current detecting limiter unit comprises:
a third transistor having a base connected to the collector of the second transistor, a collector connected to the emitter of the second transistor, and an emitter coupled to output the limiter current.

14. The circuit of claim 13, wherein the third transistor comprises an NPN type transistor.

* * * * *